United States Patent
Lim

(10) Patent No.: US 10,484,620 B2
(45) Date of Patent: Nov. 19, 2019

(54) IMAGE SENSOR HAVING OPTICAL FILTER AND OPERATING METHOD THEREOF

(71) Applicant: SK hynix Inc., Gyeonggi-do (KR)

(72) Inventor: Sung-Woo Lim, Gangwon-do (KR)

(73) Assignee: SK hynix Inc., Gyeonggi-do (KR)

( * ) Notice: Subject to any disclaimer, the term of this patent is extended or adjusted under 35 U.S.C. 154(b) by 67 days.

(21) Appl. No.: 15/795,475

(22) Filed: Oct. 27, 2017

(65) Prior Publication Data
US 2018/0288298 A1 Oct. 4, 2018

(30) Foreign Application Priority Data
Apr. 4, 2017 (KR) .................. 10-2017-0043661

(51) Int. Cl.
| | |
|---|---|
| *H04N 5/238* | (2006.01) |
| *H04N 5/225* | (2006.01) |
| *H01L 27/146* | (2006.01) |
| *G02F 1/1343* | (2006.01) |
| *G02F 1/1339* | (2006.01) |
| *H04N 5/355* | (2011.01) |
| *H04N 9/04* | (2006.01) |
| *H04N 5/359* | (2011.01) |

(52) U.S. Cl.
CPC ......... *H04N 5/238* (2013.01); *G02F 1/13394* (2013.01); *G02F 1/134336* (2013.01); *H01L 27/14621* (2013.01); *H01L 27/14623* (2013.01); *H01L 27/14627* (2013.01); *H01L 27/14645* (2013.01); *H04N 5/2254* (2013.01); *H04N 5/35581* (2013.01); *H04N 9/04553* (2018.08); *H04N 9/04555* (2018.08); *H04N 9/04557* (2018.08); *G02F 2001/13398* (2013.01); *G02F 2201/121* (2013.01); *H04N 5/359* (2013.01)

(58) Field of Classification Search
CPC .... H04N 5/238; H04N 5/2254; H04N 5/3452; G02F 1/13394; G02F 1/134336; H01L 27/14621; H01L 27/14623; H01L 27/14627; H01L 27/14645
See application file for complete search history.

(56) References Cited

U.S. PATENT DOCUMENTS

| | | | | |
|---|---|---|---|---|
| 5,880,704 | A * | 3/1999 | Takezaki | G02B 27/2214 345/6 |
| 9,344,647 | B2 * | 5/2016 | Agranov | H04N 5/35572 |
| 2009/0160990 | A1 * | 6/2009 | Johnson | H04N 5/3532 348/308 |
| 2010/0283879 | A1 * | 11/2010 | Inoue | H04N 5/232 348/296 |
| 2012/0105597 | A1 * | 5/2012 | Tajiri | G03B 35/02 348/49 |
| 2012/0218450 | A1 * | 8/2012 | Pavithran | H04N 5/2254 348/296 |
| 2015/0009375 | A1 * | 1/2015 | Agranov | H04N 5/35572 348/295 |
| 2015/0085077 | A1 * | 3/2015 | Kim | H04N 5/2353 348/46 |

(Continued)

*Primary Examiner* — Nicholas G Giles
(74) *Attorney, Agent, or Firm* — IP & T Group LLP

(57) ABSTRACT

An image sensor may include: a pixel array having a plurality of unit pixels arranged in a matrix structure; and an optical filter overlapping the pixel array, and capable of blocking incident light irradiated on the plurality of unit pixels arranged in each row in the pixel array.

19 Claims, 4 Drawing Sheets

(56) References Cited

U.S. PATENT DOCUMENTS

| | | | |
|---|---|---|---|
| 2015/0208006 A1* | 7/2015 | Kim | H04N 5/361 |
| | | | 348/296 |
| 2015/0288901 A1 | 10/2015 | Tanaka | |
| 2016/0165107 A1 | 6/2016 | Oguchi | |
| 2017/0094203 A1* | 3/2017 | Barna | H04N 5/2327 |
| 2018/0081043 A1* | 3/2018 | Demirtas | G01S 7/487 |

* cited by examiner

IMAGE SENSOR HAVING OPTICAL FILTER AND OPERATING METHOD THEREOF

CROSS-REFERENCE TO RELATED APPLICATIONS

The present application claims priority under 35 U.S.C. § 119 to Korean Patent Application No. 10-2017-0043661 filed on Apr. 4, 2017 with the Korean Intellectual Property Office, the disclosure of which is incorporated herein by reference in its entirety.

BACKGROUND

1. Field

Various embodiments of the present invention relate to a semiconductor device fabrication technology, and more particularly, to an image sensor having an optical filter capable of selectively blocking incident light, and an operating method thereof.

2. Description of the Related Art

An image sensor may be referred to as a device that converts an optical image into an electrical signal. Recently, with the development of computer industry and communication industry, the demand for an enhanced image sensor with a high integration density is increasing in various fields such as a digital camera, a camcorder, a personal communication system (PCS), a game machine, a security camera, a medical micro-camera, and a robot.

SUMMARY

Various embodiments of the present invention are directed to an enhanced image sensor.

In an embodiment, an image sensor may include: a pixel array having a plurality of unit pixels arranged in a matrix structure; and an optical filter overlapping the pixel array, and capable of blocking incident light irradiated on the plurality of unit pixels arranged in each row in the pixel array. Furthermore, the image may further include: a color filter array inserted between the pixel array and the optical filter, and comprising a plurality of color filters corresponding to the respective unit pixels; and a plurality of light focusing elements formed over the optical filter and corresponding to the respective unit pixels The optical filter may block incident light irradiated onto the plurality of unit pixels arranged in even-numbered rows while incident light is irradiated onto the plurality of unit pixels arranged in odd-numbered rows, and blocking incident light irradiated onto the plurality of unit pixels arranged in the odd-numbered rows in the pixel array while the incident light is irradiated onto the plurality of unit pixels in the even-numbered rows.

The optical filter may include: a plurality of first electrodes extended in a row direction; a second electrode overlapping the plurality of first electrodes; and a liquid crystal layer formed between the plurality of first electrodes and the second electrode. Each of the plurality of first electrodes may overlap the plurality of unit pixels arranged in each row in the pixel array. The plurality of first electrodes correspond to the respective rows in the pixel array, the first electrodes corresponding to odd-numbered rows in the pixel array among the plurality of first electrodes may be electrically coupled to each other, and the first electrodes corresponding to even-numbered rows may be electrically coupled to each other. The second electrode r gay overlap all of the plurality of unit pixels. Each of the plurality of first electrodes may have a bar shape extended in the row direction, and the second electrode may have a plate shape.

In an embodiment, an image sensor may include: a pixel array having a plurality of unit pixels arranged in a matrix structure; and an optical filter overlapping the pixel array. The optical filter may include: a plurality of first electrodes extended in one direction; a plurality of partition walls formed between the respective first electrodes; a second electrode overlapping the plurality of first electrodes; and a plurality of liquid crystal layers formed between the plurality of first electrodes and the second electrode. Furthermore, the image may further include: a color filter array inserted between the pixel array and the optical filter, and comprising a plurality of color filters corresponding to the respective unit pixels; and a plurality of light focusing elements formed over the optical filter and corresponding to the respective unit pixels.

The optical filter may include: a first transparent substrate on which the plurality of first electrodes and the plurality of partition walls are formed; and a second transparent substrate under which the second electrode is formed, and overlapping the first transparent substrate, wherein the plurality of partition walls surround the first transparent substrate and the second transparent substrate at the edges of the first transparent substrate and the second transparent substrate. Each of the plurality of first electrodes may overlap the plurality of unit pixels arranged in each row in the pixel array. The plurality of first electrodes correspond to the respective rows in the pixel array, the first electrodes corresponding to odd-numbered rows in the pixel array among the plurality of first electrodes may be electrically coupled to each other, and the first electrodes corresponding to even-numbered rows may be electrically coupled to each other. The second electrode may overlap all of the plurality of unit pixels. The plurality of partition walls may have a higher refractive index than the plurality of liquid crystal layers. Each of the plurality of first electrodes may have a bar shape extended in the row direction, and the second electrode may have a plate shape.

In an embodiment, there is provided an operating method of an image sensor, may include: providing a pixel array having a plurality of unit pixels arranged in a matrix structure, and an optical filter overlapping the pixel array to block incident light irradiated onto the plurality of unit pixels at each row in the pixel array; blocking, by the optical filter, incident light irradiated onto the plurality of unit pixels arranged in even-numbered rows in the pixel array during a first time in which the incident light is irradiated onto the plurality of unit pixels arranged in odd-numbered rows; and blocking, by the optical filter, incident light irradiated onto the plurality of unit pixels arranged in the odd-numbered rows in the pixel array during a second time in which the incident light is irradiated onto the plurality of unit pixels arranged in the even-numbered rows. Furthermore, the image may further include: a color filter array comprising a plurality of color filters corresponding to the respective unit pixels is inserted between the pixel array and the optical filter; and a plurality of light focusing elements corresponding to the respective unit pixels are formed over the optical filter.

The first time in which incident light is irradiated onto the plurality of unit pixels arranged in odd-numbered rows may be different from second time in which incident light is irradiated onto the plurality of unit pixels arranged in even-numbered rows. The blocking, by the optical filter, of incident light irradiated onto the plurality of unit pixels arranged in the even-numbered rows and the blocking, by the optical filter, of incident light irradiated onto the plurality of unit pixels in the odd-numbered rows may be alternately repeated.

The optical filter may include: a plurality of first electrodes having a bar shape extended in the row direction overlapping the plurality of unit pixels arranged in each row in the pixel array; a plurality of partition walls formed between the respective first electrodes; a second electrode having a plate shape overlapping the plurality of first electrodes and having a plate shape; and a plurality of liquid crystal layers formed between the plurality of first electrodes and the second electrode. The blocking, by the optical filter, of incident light irradiated onto the plurality of unit pixels arranged in the even-numbered rows comprises applying a bias to the second electrode and the plurality of first electrodes corresponding to the even-numbered rows in the pixel array, and the blocking, by the optical filter, of incident light irradiated onto the plurality of unit pixels in the odd-numbered rows comprises applying a bias to the second electrode and the plurality of first electrodes corresponding to the odd-numbered rows in the pixel array.

DETAILED DESCRIPTION

Figure 1:
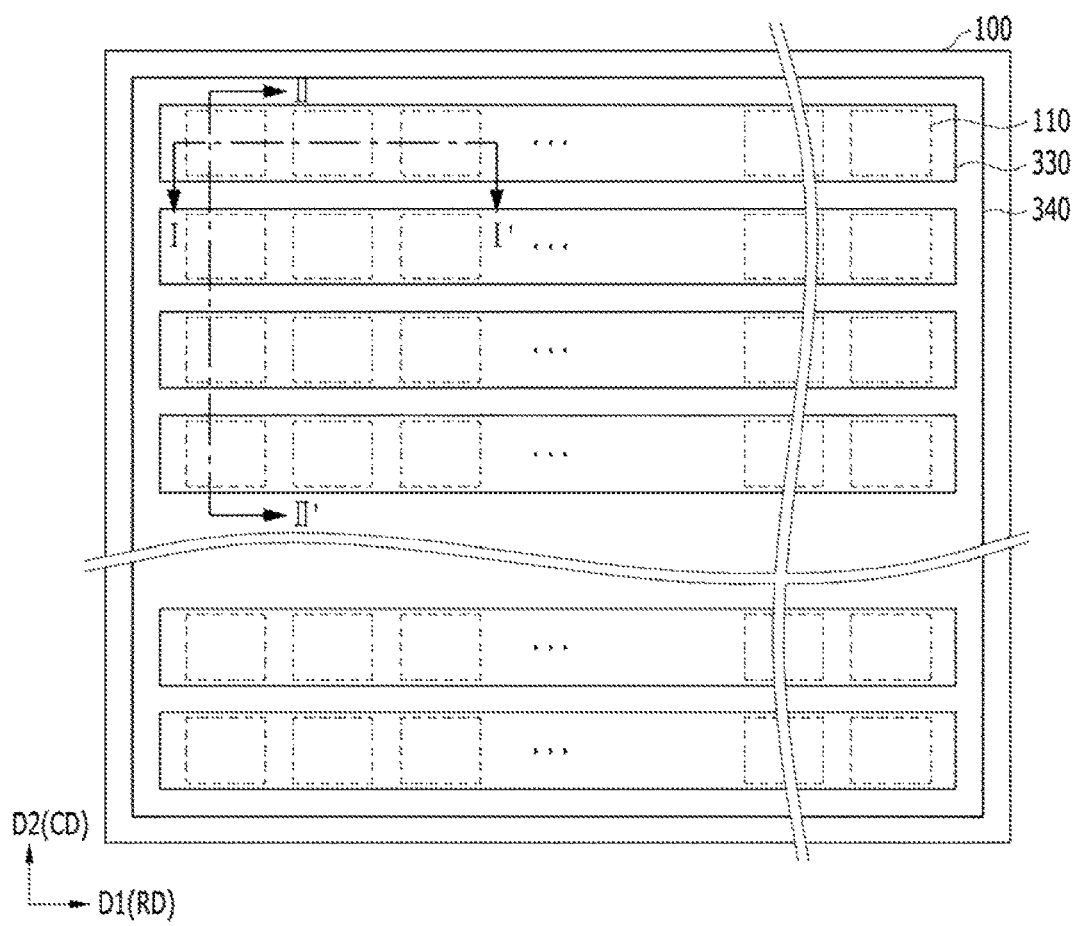
FIG. 1 is a plan view illustrating a pixel array of an image sensor, according to an embodiment of the present invention.

Various embodiments will be described below in more detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various embodiments may provide are enhanced image sensor. The enhanced image sensor may indicate an image sensor capable of providing an improved image quality by preventing an optical crosstalk. Recently, the research has been actively performed on backside deep trench isolation (BDTI), high-performance color filters, and grid patterns, to prevent the optical crosstalk, which frequently occurs with the increase in integration density of the image sensor. However, the above-described methods may cause side effects such as a quantum efficiency decrease and a fill factor reduction. Therefore, the image sensor according to the embodiment of the present invention may include an optical filter capable of selectively blocking incident light to prevent the optical crosstalk.

Figure 2:
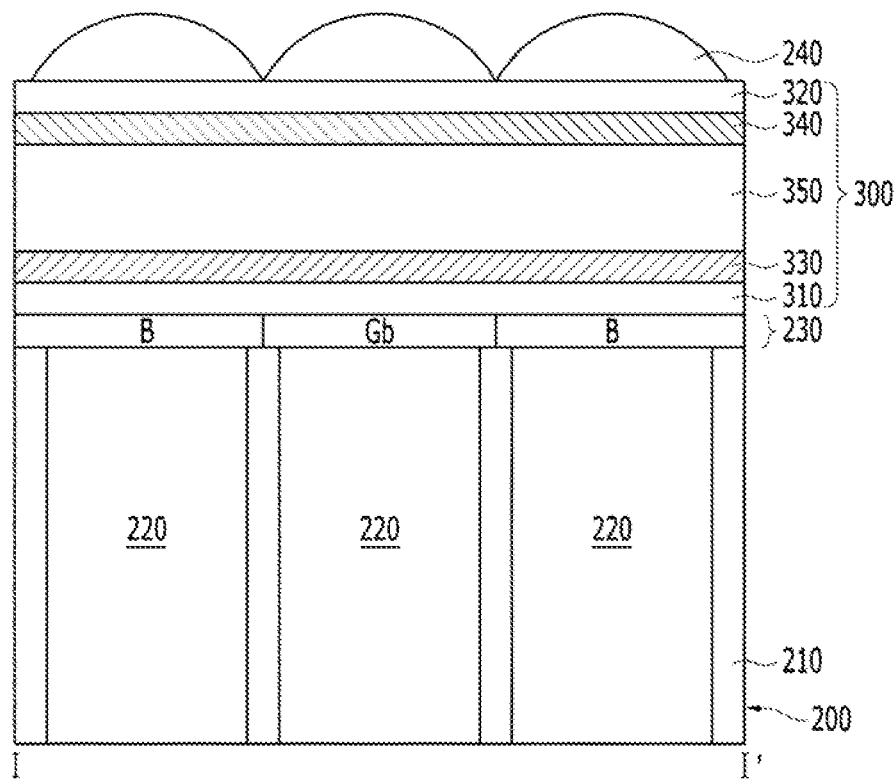
FIGS. 2 and 3 are cross-sectional views of an image sensor, according to an embodiment of the present invention taken along lines I-I' and II-II' of FIG. 1.
Figure 3:
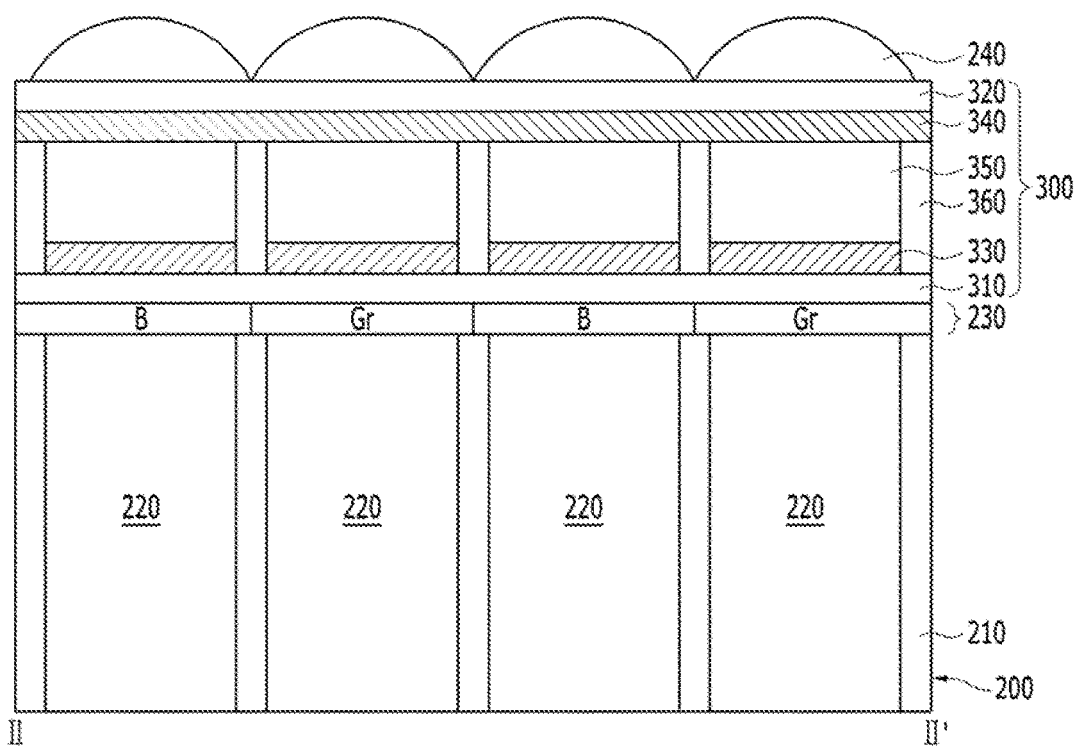

FIG. 1 is a plan view illustrating a pixel array of an image sensor according to an embodiment of the present invention. FIGS. 2 and 3 are cross-sectional views of the image sensor according to the embodiment of the present invention, taken along lines I-I' and II-II' of FIG. 1.

As illustrated in FIGS. 1 to 3, the image sensor may include a pixel array 100 and a substrate 200. The pixel array 100 may include a plurality of unit pixels 110 arranged in a matrix structure, and the substrate 200 may include a plurality of photoelectric conversion elements 220 corresponding to the respective unit pixels 110. The plurality of photoelectric conversion elements 220 may be isolated from each other by a plurality of isolation structures 210 formed in the substrate 200. Each of the isolation structures 210 may be positioned between the respective photoelectric conversion elements 220.

The pixel array 100 may include the plurality of unit pixels 110 arranged in an M×N matrix structure where M and N are natural numbers. Therefore, the plurality of unit pixels 110 may be aligned in a first direction D1 and a second direction D2. For reference, the first direction D1 may be set to a row direction RD, and the second direction D2 intersecting with the first direction D1 may be set to a column direction CD.

The substrate 200 may include a semiconductor substrate. The semiconductor substrate may have a single crystal state, and include a silicon containing material. That is, the substrate 200 may include a single-crystal silicon containing material. For example, the substrate 200 may include a bulk silicon substrate. The substrate 200 may be a substrate thinned through a thinning process.

The isolation structures 210 may include a shallow trench isolation (STI), a deep trench isolation (DTI), or a potential barrier. The potential barrier may include an impurity region (not illustrated) formed by implanting impurities into the substrate 200. For example, the potential barrier may include a P-type impurity region formed by implanting boron as the P-type impurities into the substrate 200. The isolation structures 210 may be implemented with any one of the STI, DTI, and potential barrier or any combinations thereof. For reference, the present embodiment is exemplified by the case in which the isolation structures 210 are potential barriers.

The photoelectric conversion element 220 may include a photodiode, a photo transistor, a photo gate, a pinned photo diode (PPD), or a combinations thereof. For example, the photoelectric conversion element 220 may include an organic or/and inorganic photodiode. The photoelectric conversion element 220 may include any one of the organic and inorganic photodiodes, or have a stacked structure of the organic and inorganic photodiodes.

The image sensor according to the embodiment of the present invention may include an optical filter 300, which is formed over the substrate 200 to overlap the pixel array 100 and block incident light irradiated onto the plurality of unit pixels 110 for each row from the pixel array 100. As the optical filter 300 is positioned adjacent to the plurality of photoelectric conversion elements 220, the optical filter 300 can prevent an optical crosstalk more effectively.

The optical filter 300 may include a first transparent substrate 310, a plurality of first electrodes 330, a plurality of partition walls 360, a second transparent substrate 320, a second electrode 340, and a plurality of liquid crystal layers 350. The plurality of first electrodes 330 may be formed over the first transparent substrate 310. The plurality of partition walls 360 may be formed over the first transparent substrate 310 and positioned between the respective first electrodes 330. The second electrode 340 may be formed under the second transparent substrate 320 to be in contact with the plurality of partition walls 360. The plurality of liquid crystal layers 350 may be formed between the plurality of first electrodes 330 and the second electrode 340. The first transparent substrate 310, the plurality of first electrodes 330, the plurality of partition walls 360, the second transparent substrate 320, the second electrode 340, and the plurality of liquid crystal layer 350, all of which constitute the optical filter 300, may include a material having a light transmission characteristic. Although not illustrated, the first transparent substrate 310 and the second transparent substrate 320 of the optical filter 300 may further include a polarizing film (not illustrated) formed thereon.

The first transparent substrate 310 and the second transparent substrate 320 may include a material with a high optical transmittance, for example, a glass substrate. The first transparent substrate 310 and the second transparent substrate 320 may transmit a specific or a whole wavelength range of incident light. For example, the first transparent substrate 310 and the second transparent substrate 320 may transmit only visible light of incident light. In the present embodiment, the glass substrate may be used as the first transparent substrate 310 and the second transparent substrate 320. However, the present embodiment is not limited thereto, and various other materials with a high optical transmittance may be applied as the first transparent substrate 310 and second transparent substrate 320.

The plurality of first electrodes 330 and the second electrode 340 may include a transparent conducting oxide (TCO). For example, the plurality of first electrodes 330 and the second electrode 340 may include an indium tin oxide (ITO). The plurality of first electrodes 330 may have a bar shape extended in the first direction D1, while being electrically separated from each other in the second direction D2 by the plurality of partition walls 360. Each of the plurality of first electrodes 330 may overlap the plurality of unit pixels 110 aligned in the first direction D1 in the pixel array 100. That is, each of the plurality of first electrodes 330 may be arranged to correspond to the respective rows in the pixel array 100. Among the plurality of first electrodes 330, the first electrodes 330 corresponding to the odd-numbered rows in the pixel array 100 may be electrically coupled to each other, and the first electrodes 330 corresponding to the even-numbered rows may be electrically coupled to each other. The second electrode 340 may overlap all of the plurality of first electrodes 330, and have a plate shape. Therefore, the second electrode 340 may overlap all of the plurality of unit pixels 110. Due to the shapes of the plurality of first electrodes 330 and the second electrode 340, the optical filter 300 may have a high response speed or an operating speed, on a row by row basis.

The plurality of liquid crystal layers 350 may selectively block or transmit incident light in response to a bias applied to the plurality of the first electrodes 330 and the second electrode 340. Furthermore, the plurality of liquid crystal layers 350 can prevent the optical crosstalk using the properties of liquid crystals that adjust propagation and polarizing directions of incident light. This is because the liquid crystals aligned in one direction serve as a blocking member capable of preventing the optical crosstalk in response to the bias applied to the plurality of the first electrodes 330 and the second electrode 340.

The plurality of partition walls 360 may include a transparent insulating material. The plurality of partition walls 360 may serve to maintain a vertical distance between the first transparent substrate 310 and the second transparent substrate 320, and to provide the space in which the plurality of liquid crystal layers 350 are to be formed. The plurality of partition walls 360 may surround the first transparent substrate 310 and the second transparent substrate 320 along the edges of the first transparent substrate 310 and the second transparent substrate 320. That is, the optical filter 300 may seal the plurality of liquid crystal layers 350 using the first transparent substrate 310, the second transparent substrate 320, and the plurality of partition walls 360. Furthermore, the plurality of partition walls 360 may serve to more effectively prevent the optical crosstalk with the plurality of liquid crystal layers 350. For this structure, the plurality of partition walls 360 may include a material having a larger refractive index than that of the plurality of liquid crystal layers 350. The plurality of partition walls 360 may have a bar shape extended in the first direction D1, while being separated from each other in the second direction D2. Therefore, the plurality of partition walls 360 can prevent an optical crosstalk caused by incident light propagating in the second direction D2.

The image sensor according to the embodiment of the present invention may include a color filter array 230 and a plurality of light focusing elements 240. The color filter array 230 may be formed between the substrate 200 and the optical filter 300, and include a plurality of color filters corresponding to the respective unit pixels 110. The plurality of light focusing elements 240 may be formed over the optical filter 300 and correspond to the respective unit pixels 110. Such a structure in which the optical filter 300 is positioned between the color filter array 230 and the plurality of light focusing elements 240 can prevent a loss of incident light irradiated on the plurality of photoelectric conversion elements 220 as much as possible, improving a quantum efficiency of the image sensor.

Each of the color filters may include a filter including red filter, green filter, blue filter, cyan filter, yellow filter, magenta filter, white filter, black filter, IR cutoff filter, IR pass filter and band pass filter for passing a specific wavelength band, or a multi-filter including two or more filters thereof. For reference, the present embodiment is exemplified by the case in which the color filter array 230 has a Bayer pattern that a red filter R, green filters Gr and Gb, and a blue filter B are repeated. The light focusing elements 240 may include a digital lens or hemispherical lens.

As described above, the image sensor according to the embodiment of the present invention may include the optical filter 300 having the plurality of liquid crystal layers 350 in order to effectively prevent the optical crosstalk. Therefore, the present embodiment can replace the BDTI, the high-performance color filter, and the grid pattern technology, all of which had been introduced in the prior technology to prevent the optical crosstalk. Furthermore, and the present embodiment may fundamentally prevent side effects, for example, a decrease in the quantum efficiency or a fill factor reduction.

Hereafter, an operating method of the image sensor having the optical filter 300 according to the embodiment of the present invention will be described.

Referring to FIGS. 1 to 3, the operating method of the image sensor having the optical filter 300 will be described. The optical filter 300 may block incident light irradiated onto the plurality of unit pixels 110 arranged in the even-numbered rows in the pixel array 100. For this operation, the bias may be applied to the second electrode 340 and the first electrodes 330 arranged in the even-numbered rows of the pixel array 100 among the plurality of first electrodes 330. Therefore, incident light irradiated onto the plurality of unit pixels 110 arranged in the even-numbered rows in the pixel array 100 may be blocked by the optical filter 300, and incident light may be irradiated onto the plurality of unit pixels 110 arranged in the odd-numbered rows.

Then, during a first time in which incident light is irradiated onto the plurality of unit pixels 110 arranged in the odd-numbered rows in the pixel array 100, the optical filter 300 may block incident light irradiated onto the plurality of unit pixels 110 arranged in the even-numbered rows in the pixel array 100. Since the optical filter 300 blocks incident light irradiated onto the plurality of unit pixels 110 arranged in the even-numbered rows in the pixel array 100, that is, the plurality of unit pixels 110 adjacent to the plurality of unit pixels 110 arranged in the odd-numbered rows during the first time, the optical crosstalk can be prevented.

Then, pixel signals from the plurality of unit pixels 110 arranged in the odd-numbered rows of the pixel array 100 may be outputted to a signal processing unit (not illustrated). At this time, the pixel signals may be sequentially outputted for each of the rows. The signal processing unit (not illustrated) may include a correlated double sampling, an analog-digital converter, a ramp signal generator, and the like. Hereafter, a series of operations of outputting the pixel signals from the plurality of unit pixels 110 to the signal processing unit (not illustrated) after irradiating incident light onto the plurality of unit pixels 110 arranged in the odd-numbered rows in the pixel array 100 for the first time while incident light irradiated onto the plurality of unit pixels 110 arranged in the even-numbered rows in the pixel array 100 is blocked by the optical filter 300 will be referred to as 'first operation'.

Then, incident light irradiated onto the plurality of unit pixels 110 arranged in the odd-numbered rows in the pixel array 100 may be blocked by the optical filter 300. For this operation, the bias may be applied to the second electrode 340 and the first electrodes 330 corresponding to the odd-numbered rows of the pixel array 100 among the plurality of first electrodes 330. Therefore, incident light irradiated onto the plurality of unit pixels 110 arranged in the odd-numbered rows in the pixel array 100 may be blocked by the optical filter 300, and incident light may be irradiated onto the plurality of unit pixels 110 arranged in the even-numbered rows.

Then, during a second time in which incident light is irradiated onto the plurality of unit pixels 110 arranged in the even-numbered rows in the pixel array 100, the optical filter 300 may block incident light irradiated onto the plurality of unit pixels 110 arranged in the odd-numbered rows in the pixel array 100. Since the optical filter 300 blocks incident light irradiated onto the plurality of unit pixels 110 arranged in the odd-numbered rows in the pixel array 100, that is, the plurality of unit pixels 110 adjacent to the plurality of unit pixels 110 arranged in the even-numbered rows during the second time, the optical crosstalk can be prevented.

The first and second times may be equal to or different from each other. In the latter case, different integration times may be set for the respective rows in the pixel array 100. Therefore, a high dynamic range (HDR) characteristic can be easily improved without changing the configurations of the unit pixels 110, the pixel array 100, and the peripheral circuits.

Then, pixel signals from the plurality of unit pixels 110 arranged in the even-numbered rows of the pixel array 100 may be outputted to the signal processing unit (not illustrated). At this time, the pixel signals may be sequentially outputted for each of the rows. Hereafter, a series of operations of outputting the pixel signals from the plurality of unit pixels 110 to the signal processing unit (not illustrated) after irradiating incident light onto the plurality of unit pixels 110 arranged in the even-numbered rows in the pixel array 100 during the second time while incident light irradiated onto the plurality of unit pixels 110 arranged in the odd-numbered rows in the pixel array 100 is blocked by the optical filter 300 will be referred to as 'second operation'.

The first and second operations may be performed once to acquire an image frame. Furthermore, the first and second operations may be alternately performed plurality of times to acquire the image frame or moving images. By acquiring the image through the first and second operations, the image sensor can acquire a high-quality image while preventing the optical crosstalk. Furthermore, since the integration time of the first operation, that is, the first time of the first operation and the second time of the second operation can be controlled by the optical filter 300, the HDR characteristic can be easily improved.

The above-described image sensor may be used in various electronic devices or systems. Hereafter, an application of the image sensor to a camera, according to embodiments of the present invention, will be described with reference to FIG. 4.

Figure 4:
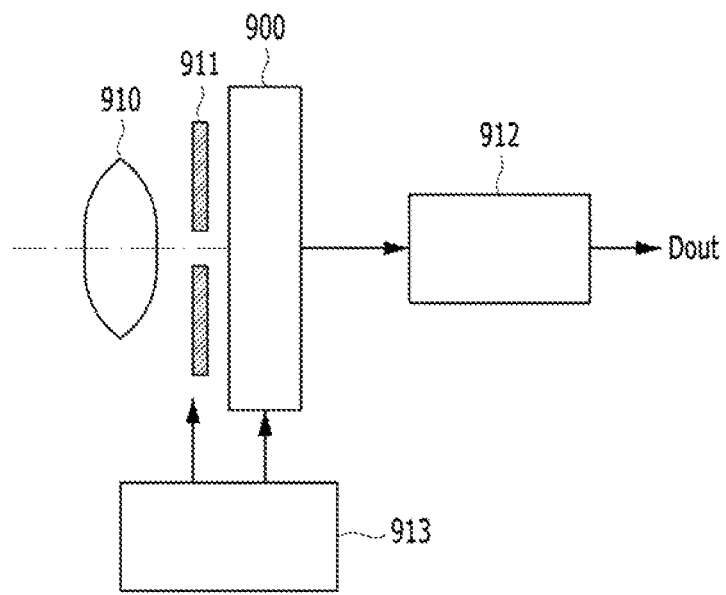
FIG. 4 is a diagram schematically illustrating an electronic device including an image sensor, according to an embodiment of the present invention.

FIG. 4 is a diagram schematically illustrating an electronic device including the image sensor according to the embodiments of the present invention.

Referring to FIG. 4, the electronic device including the image sensor may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 may guide an image light (incident light) from an object to a pixel array (see the reference numeral 100 of FIG. 1) of the image sensor 900. The optical system 910 may be constructed by a plurality of optical lenses. The shutter unit 911 may control a light irradiation period and a light shielding period for the image sensor 900. The driving unit 913 may control a transmission operation of the image sensor 900 and a shutter operation of the shutter unit 911. The signal processing unit 912 may perform various kinds of signal processing for the signal outputted from the image sensor 900. After the signal processing, an image signal Dout may be stored in a storage medium such as a memory, be outputted to a monitor, or the like.

According to the embodiments of the present invention, the image sensor may include an optical filter having a liquid crystal layer, thereby effectively preventing an optical crosstalk.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a pixel array having a plurality of unit pixels arranged in a matrix structure and a substrate having a plurality of photoelectric conversion elements corresponding to the plurality of unit pixels;
   an optical filter overlapping the pixel array, and capable of blocking incident light irradiated on the plurality of unit pixels arranged in each of a plurality of rows in the pixel array;
   a color filter array inserted between the pixel array and the optical filter, and comprising a plurality of color filters corresponding to the plurality of unit pixels; and
   a plurality of light focusing elements formed over the optical filter and corresponding to the plurality of unit pixels,
   wherein the optical filter is positioned between the color filter array and the plurality of light focusing elements.

2. The image sensor of claim 1, wherein the optical filter blocks incident light irradiated onto the plurality of unit pixels arranged in even-numbered rows while incident light is irradiated onto the plurality of unit pixels arranged in odd-numbered rows, and blocking incident light irradiated onto the plurality of unit pixels arranged in the odd-numbered rows in the pixel array while the incident light is irradiated onto the plurality of unit pixels in the even-numbered rows.

3. The image sensor of claim 1, wherein the optical filter comprises:
   a plurality of first electrodes extended in a row direction;
   a second electrode overlapping the plurality of first electrodes; and
   a liquid crystal layer formed between the plurality of first electrodes and the second electrode.

4. The image sensor of claim 3, wherein each of the plurality of first electrodes overlaps the plurality of unit pixels arranged in each of the plurality of rows in the pixel array.

5. The image sensor of claim 3, wherein the plurality of first electrodes correspond to the plurality of rows in the pixel array, the plurality of first electrodes corresponding to odd-numbered rows in the pixel array among the plurality of first electrodes are electrically coupled to each other, and the plurality of first electrodes corresponding to even-numbered rows are electrically coupled to each other.

6. The image sensor of claim 3, wherein the second electrode overlaps all of the plurality of unit pixels.

7. The image sensor of claim 3, wherein each of the plurality of first electrodes has a bar shape extended in the row direction, and the second electrode has a plate shape.

8. An image sensor comprising:
   a pixel array having a plurality of unit pixels arranged in a matrix structure and a substrate having a plurality of photoelectric conversion elements corresponding to the plurality of unit pixels;
   an optical filter overlapping the pixel array;
   a color filter array inserted between the pixel array and the optical filter, and comprising a plurality of color filters corresponding to the plurality of unit pixels; and
   a plurality of light focusing elements formed over the optical filter and corresponding to the plurality of unit pixels,
   wherein the optical filter is positioned between the color filter array and the plurality of light focusing elements,
   wherein the optical filter comprises:
   a plurality of first electrodes extended in one direction;
   a plurality of partition walls formed between the plurality of first electrodes;
   a second electrode overlapping the plurality of first electrodes; and
   a plurality of liquid crystal layers formed between the plurality of first electrodes and the second electrode.

9. The image sensor of claim 8, wherein the optical filter comprises:
   a first transparent substrate on which the plurality of first electrodes and the plurality of partition walls are formed; and
   a second transparent substrate under which the second electrode is formed, and overlapping the first transparent substrate,
   wherein the plurality of partition walls surround the first transparent substrate and the second transparent substrate at the edges of the first transparent substrate and the second transparent substrate.

10. The image sensor of claim 8, wherein each of the plurality of first electrodes overlaps the plurality of unit pixels arranged in each of a plurality of rows in the pixel array.

11. The image sensor of claim 8, wherein the plurality of first electrodes correspond to the plurality of rows in the pixel array, the first electrodes corresponding to odd-numbered rows in the pixel array among the plurality of first electrodes are electrically coupled to each other, and the first electrodes corresponding to even-numbered rows are electrically coupled to each other.

12. The image sensor of claim 8, wherein the second electrode overlaps all of the plurality of unit pixels.

13. The image sensor of claim 8, wherein the plurality of partition walls has a higher refractive index than the plurality of liquid crystal layers.

14. The image sensor of claim 8, wherein each of the plurality of first electrodes has a bar shape extended in the row direction, and the second electrode has a plate shape.

15. An operating method of an image sensor, comprising:
   providing a pixel array having a plurality of unit pixels arranged in a matrix structure, and an optical filter overlapping the pixel array to block incident light irradiated onto the plurality of unit pixels at each of a plurality of rows in the pixel array;
   blocking, by the optical filter, incident light irradiated onto the plurality of unit pixels arranged in even-numbered rows in the pixel array during a first time in which the incident light is irradiated onto the plurality of unit pixels arranged in odd-numbered rows; and
   blocking, by the optical filter, incident light irradiated onto the plurality of unit pixels arranged in the odd-numbered rows in the pixel array during a second time in which the incident light is irradiated onto the plurality of unit pixels arranged in the even-numbered rows,
   wherein a color filter array comprising a plurality of color filters corresponding to the respective unit pixels is inserted between the pixel array and the optical filter,
   wherein a plurality of light focusing elements corresponding to the respective unit pixels are formed over the optical filter, and
   wherein the optical filter is positioned between the color filter array and the plurality of light focusing elements.

16. The operating method of claim 15, wherein the first time in which incident light is irradiated onto the plurality of unit pixels arranged in odd-numbered rows is different from the second time in which incident light is irradiated onto the plurality of unit pixels arranged in even-numbered rows.

17. The operating method of claim 15, wherein the blocking, by the optical filter, of incident light irradiated onto the plurality of unit pixels arranged in the even-numbered rows and the blocking, by the optical filter, of incident light irradiated onto the plurality of unit pixels in the odd-numbered rows are alternately repeated.

18. The operating method of claim 15, wherein the optical filter comprises:
- a plurality of first electrodes having a bar shape extended in the row direction overlapping the plurality of unit pixels arranged in each of the plurality of rows in the pixel array;
- a plurality of partition walls formed between the plurality of first electrodes;
- a second electrode having a plate shape overlapping the plurality of first electrodes and having the bar shape; and
- a plurality of liquid crystal layers formed between the plurality of first electrodes and the second electrode.

19. The operating method of claim 18, wherein the blocking, by the optical filter, of incident light irradiated onto the plurality of unit pixels arranged in the even-numbered rows comprises applying a bias to the second electrode and the plurality of first electrodes corresponding to the even-numbered rows in the pixel array, and
- the blocking, by the optical filter, of incident light irradiated onto the plurality of unit pixels in the odd-numbered rows comprises applying a bias to the second electrode and the plurality of first electrodes corresponding to the odd-numbered rows in the pixel array.

* * * * *